United States Patent [19]

Tu

[11] Patent Number: 5,345,101

[45] Date of Patent: Sep. 6, 1994

[54] HIGH VOLTAGE SEMICONDUCTOR STRUCTURE AND METHOD

[75] Inventor: Shang-Hui Tu, Chandler, Ariz.

[73] Assignee: Motorola, Inc., Schaumburg, Ill.

[21] Appl. No.: 82,643

[22] Filed: Jun. 28, 1993

[51] Int. Cl.$^5$ ............... H01L 29/40; H01L 29/06
[52] U.S. Cl. .................. 257/495; 257/653; 257/927
[58] Field of Search ........... 257/495, 607, 653, 655, 257/927

[56] References Cited

U.S. PATENT DOCUMENTS

| | | | |
|---|---|---|---|
| 4,774,560 | 9/1988 | Coe | 257/495 |
| 5,075,739 | 12/1991 | Davies | 357/13 |

OTHER PUBLICATIONS

T. Ma et al., "Junction Breakdown Analysis of a Floating Field-Emitting Ring Structure using a Pisces-2B Device Simulator", Solid-State Electronics, vol. 35, No. 2, pp. 201-205, 1992.

M. Adler et al., "Theory and Breakdown Voltage for Planar Devices with a Single Field Limiting Ring", IEEE Transactions on Electronic Devices, vol. Ed. 24, No. 2, Feb. 1977, pp. 107-112.

Primary Examiner—Mark V. Prenty
Attorney, Agent, or Firm—Frederick M. Fliegel

[57] ABSTRACT

A high voltage semiconductor structure (10) includes a semiconductor substrate (11) of a first conductivity type. The structure (10) also includes a first region (12) providing a main rectifying junction, a second region (13, 17, 21) of a second conductivity type formed in the semiconductor substrate and surrounding the first region ( 12 ) and a third region (14, 18, 22) of the second conductivity type. The third region (14, 18, 22) has reduced conductivity and greater junction depth compared to the second region (13, 17, 21). The third region (14, 18, 22) surrounds and is in contact with the second region (13, 17, 21) to form field rings which improve (increase) breakdown voltage of the high voltage semiconductor structure (10).

9 Claims, 1 Drawing Sheet

# HIGH VOLTAGE SEMICONDUCTOR STRUCTURE AND METHOD

FIELD OF THE INVENTION

This invention relates, in general, to the field of high voltage semiconductor devices, and, more particularly, to a floating field ring having improved breakdown characteristics.

BACKGROUND OF THE INVENTION

High voltage semiconductor devices employ a variety of techniques to reduce surface breakdown effects limiting performance of such devices. Edges of doped regions tend to have cylindrical or spherical shapes resulting in higher electric fields being formed under reverse bias in portions of the depletion region at semiconductor device surfaces. These higher fields often result in avalanche breakdown at substantially lower voltages than expected based on the electric fields associated with the remainder of the device.

A variety of techniques have been developed to control the electric field geometry in depeletion regions at p-n junction edges. These include beveling device edges, in areas forming depletion regions, by chemical and/or mechanical techniques or creating one or more "floating field rings" or junction termination extension techniques. Beveling techniques can be labor intensive and require large depletion regions (circa 100 micrometers) in order to place the beveled region in coincidence with the depletion region with sufficient accuracy to be effective. Floating field rings increase breakdown voltages but require substantial area and do not achieve breakdown voltages expected for the bulk of the p-n junction. Junction termination techniques relying on (usually laterally) graduated doping provide near-ideal avalanche-limited breakdown voltages but tend to be implemented using photolithographic and doping techniques susceptible to processing variations which can reduce yields and/or provide sub-optimal device performance.

What are needed are methods and apparatus for providing high voltage devices having improved breakdown voltages and acceptable area requirements and which are realized through robust processing techniques.

SUMMARY OF THE INVENTION

Briefly stated, there is provided a new and improved high voltage semiconductor structure and also a method for manufacturing same. A high voltage semiconductor structure includes a semiconductor substrate of a first conductivity type. The structure also includes a first region providing a main rectifying junction, a second region of a second conductivity type formed in the semiconductor substrate and surrounding the first region and a third region of the second conductivity type. The third region has reduced conductivity compared to the second region. The third region surrounds and is in contact with one side of the second region.

DETAILED DESCRIPTION OF THE DRAWING

Figure 1:
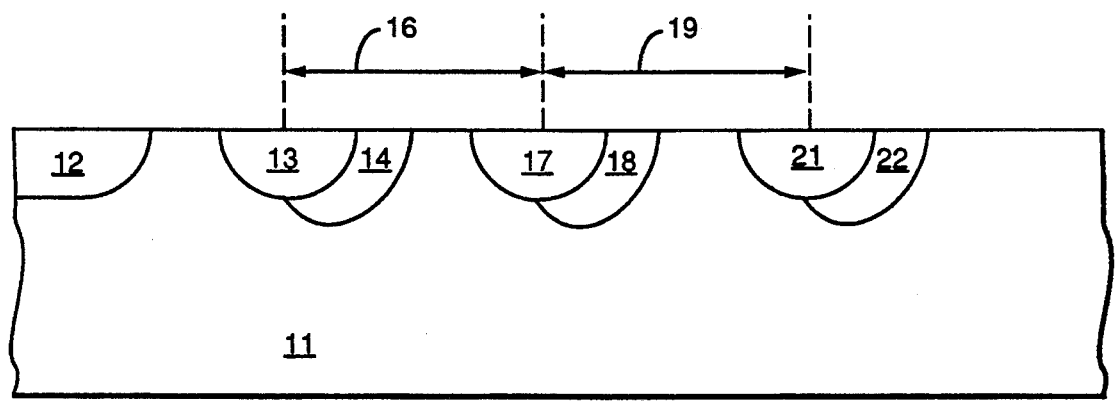
FIG. 1 illustrates a highly enlarged cross-sectional view of a portion of a high voltage semiconductor structure in accordance with the present invention.

FIG. 1 illustrates a highly enlarged cross-sectional view of portion 10 of a high voltage semiconductor structure in accordance with the present invention. Floating guard rings are used in high voltage devices, e.g., those handling 50 volts or more. It should be understood that although FIG. 1 illustrates a multiple guard ring structure, the present invention is applicable to structures having more or fewer guard rings or a single guard ring, with correspondingly higher or lower breakdown voltages. High voltage semiconductor structure portion 10 includes semiconductor material 11 having doping, conductivity and thickness chosen to meet a predetermined breakdown voltage requirement. A wide range of conductivities and dopant densities may be used with only slight modification of the present invention. Choice of resistivity, dopant species, semiconductor material, thickness, etc., are well known to these of skill in the art. Semiconductor material 11 may be a layer formed on a semiconductor substrate by epitaxial or other techniques known in the art or may be a substrate having predetermined characteristics. Semiconductor material 11 is referred to herein as substrate 11 with the understanding that these variations are included in this designation.

Figure 2:
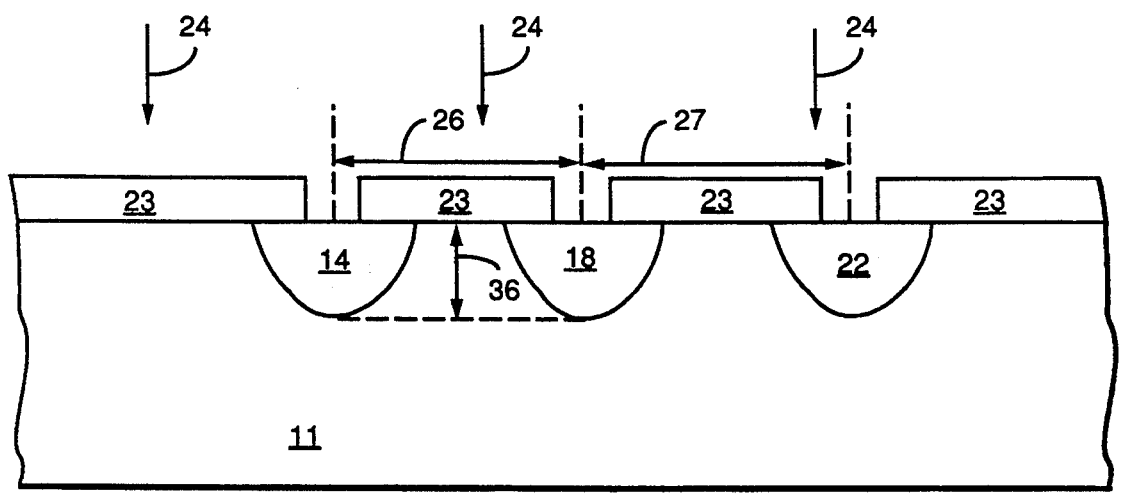
FIG. 2 illustrates a highly enlarged cross-sectional view of the portion of FIG. 1 at an early stage in processing.
Figure 3:
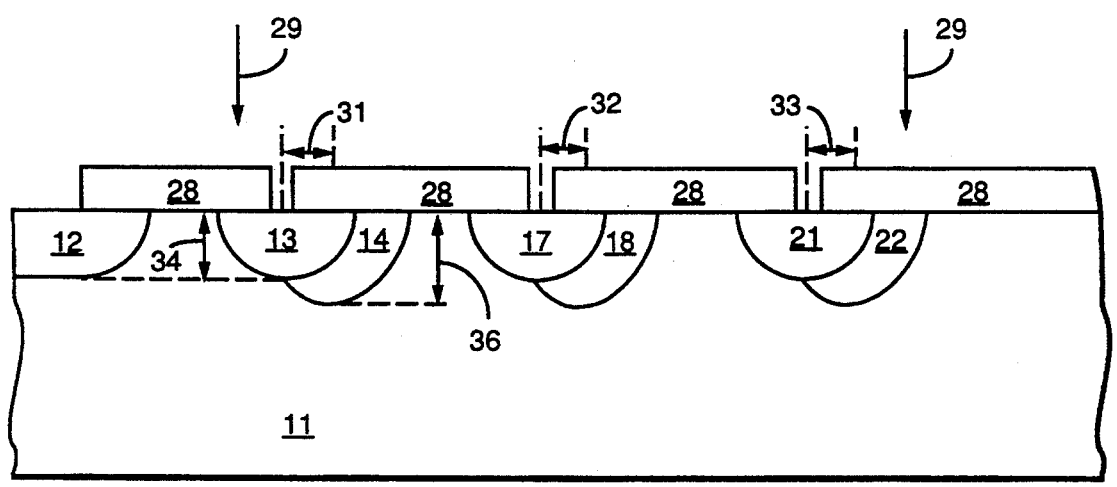
FIG. 3 illustrates a highly enlarged cross-sectional view of the portion of FIG. 1 at a later stage in processing.

First region 12 is exemplary of high voltage active devices, e.g., IGBTs or insulated gate bipolar transistors, power FETs, Schottky barrier diodes or any other high voltage device built on dice formed from substrate 11. As illustrated, first region 12 has opposite conductivity type to substrate 11, forming a primary p-n junction. First region 12 may be replaced by a Schottky barrier, forming a Schottky diode or Schottky contact to substrate 11. Electrical contacts to the two sides of the primary junction are formed by contacts (not shown) to first region 12 and substrate 11 by techniques well known in the art. Guard rings comprising second regions 13, 17, 21 and third regions 14, 18, 22, respectively, are formed surrounding and apart from first region 12 at a first surface of substrate 11. The guard rings are typically formed on the planar surface of substrate 11 and follow the edges around the periphery of a die. The views provided in FIGS. 1–3 are partial edge views and all edge views of the guard rings are similar. In other words, the guard rings surround or encircle the active elements (represented by first region 12) on substrate 11.

Second regions 13, 17, 21 and third regions 14, 18, 22 are of opposite conductivity type to substrate 11 and thus form auxiliary p-n junctions surrounding the primary junction. The present invention differs from previous field ring structures in at least the following three ways: (1) by including third regions 14, 18, 22, in addition to second regions 13, 17, 21; (2) in the relative spacing of second regions 13, 17, 21 to third regions 14, 18, 22 and (3) in the spacing of the guard ring structures including second regions 13, 17, 21 and third regions 14, 18, 22 relative to one another.

Center-to-center spacing between second regions 13, 17 is represented by distance 16 while center-to-center spacing between second regions 17, 21 is represented by distance 19. In a preferred embodiment, distance 16 is greater than distance 19 because depletion region curvature is smaller farther from the primary junction; however, equispaced (i.e., distance 16 equal to distance 19) or even greater spacing (i.e., distance 16 smaller than distance 19 by some amount can be used as taught in U. S. Pat. No. 5,074,739, issued Dec. 24, 1991 to R. Davies).

This general rule holds for larger numbers of guard rings as well. The cause of one type of breakdown, avalanche breakdown, is electrical field strength high enough to cause a peak value of charge carrier multiplication factor at least one location to exceed a particular amount. Techniques for determining such spacing are usually based on the assumption that spacing between a ring and the primary junction or inter-ring spacings provides highest breakdown voltage when peak values of charge carrier multiplication factor throughout the structure reach breakdown values simultaneously. This criterion and geometries meeting same are difficult to realize in practice. Iterative techniques are typically employed in simulations to reach this condition, as is described in "Theory And Breakdown Voltage For Planar Devices With A Single Field Limiting Ring" by M. Adler et al., IEEE Trans. El. Der., Vol. 24, No. 2, Feb. 1977, pp. 107–112 and in "Junction Breakdown Analysis Of A Floating Field-Limited Ring Structure Using A Pisces-2B Device Simulator" by T. Ma et al., Solid State Electronics, Vol. 35, No. 2, pp. 201–205, which technical papers are incorporated herein by reference.

FIG. 2 illustrates a highly enlarged cross-sectional view of portion 10 of FIG. 1 at an early stage in processing. The processing steps providing third regions 14, 18, 22 include masking the top surface of substrate 11 with layer 23, creating openings in layer 23 by conventional photolithographic techniques and introducing dopant atoms into substrate 11 in patterns directed by the shapes of the openings formed in layer 23. Dopant atoms are desirably delivered to substrate 11 by ion implantation, wherein ions are indicated by arrows 24, for example. For a background doping (substrate 11) of $2.3 \times 10^{15}/cm^3$, dopant atoms are typically implanted to a dose in the range of from $3 \times 10^{12}$ to $1 \times 10^{13}$ atoms/cm$^2$, for example. Dopant atoms forming third regions 14, 18, 22 are typically diffused into substrate 11 by heating substrate 11 to a temperature of, for example, 1200° C. for a period of between five and sixty minutes to provide a reduced dopant concentration compared to first region 12 and second regions 13, 17, 21.

Center-to-center spacing between third regions 14, 18 is represented by distance 26 while center-to-center spacing between third regions 18, 22 is represented by distance 27. In general, the more lightly doped third regions 14, 18, 22 are, the smaller optimal separations 26, 27 become.

In a preferred embodiment, third regions 14, 18, 22 are formed using common processing steps, providing similar doping and junction depth 36, usually between one and ten micrometers, scaled according to breakdown voltage requirement. A junction depth of about 1.85 micrometers, for example, is used for a breakdown voltage between 100 to 200 volts.

FIG. 3 illustrates a highly enlarged cross-sectional view of portion 10 of FIG. 1 at a later stage in processing.

In a preferred embodiment, second regions 13, 17, 21 and first region 12 are formed using common processing steps, providing similar doping and junction depth. Second regions 13, 17, 21 and first region 12 are desirably defined subsequent to defining third regions 14, 18, 22 because it is desirable that third regions 14, 18, 22 extend deeper into substrate 11 than second regions 13, 17, 21. Dopant atoms are desirably delivered to and enter substrate 11 by ion implantation through openings in mask 28, wherein ions are indicated by arrows 29, for example. Center-to-center separations 31, 32, 33 of second regions 13, 17, 21 from third regions 14, 18, 22, respectively, are typically in the range of about one-half to ten micrometers and desirably in the range from one to five micrometers. Depth 34 of second regions 13, 17, 21 is usefully about 1.8 micrometers, somewhat less than depth 36 associated with third regions 14, 18, 22 (usefully about 1.85 micrometers). Depths 34 and 36 are typically between one and ten micrometers, with depth 36 greater than depth 34. Dopant atoms forming second regions 13, 17, 21 are typically implanted to a dose in the range of $8 \times 10^{15}$ atoms/cm$^2$, for example. These dopant atoms are typically diffused into substrate 11 by heating substrate 11 to a temperature of, for example, 1200° C. for a period of about thirty minutes to form second regions 13, 17, 21, providing final surface concentrations of about $8 \times 10^{19}/cm^3$. When heat treatment of first region 12 and second regions 13, 17, 21 occurs subsequent to (and the results thereof are additive to) heat treatment of third regions 14, 18, 22, the third regions will usually have greater junction depth 36 than depth 34 of first region 12 and second regions 13, 17, 21.

In one embodiment, substrate 11 is n (or n+) type, first region 12 is p (or p+) type, second regions 13, 17, 21 are p (or p+) type and third regions 14, 18, 22 are p− (or p) type, wherein substrate 11 is silicon and first region 12, second regions 13, 17, 21 and third regions 14, 18, 22 are boron doped. First region 12 and second regions 13, 17, 21 typically have substantially similar dopant concentrations therein.

A first major feature of the present invention is that the breakdown voltage of the guard ring(s) approaches the avalanche breakdown voltage of the semiconductor material forming substrate 11 while requiring fewer guard rings than previous guard ring designs allowed. A second major feature is that fewer guard rings may be employed to provide a given breakdown voltage, reducing device complexity and also providing a smaller device for a given voltage characteristic. A third major feature is that the spacing between guard rings is reduced compared to previous guard ring designs, providing a smaller device for a given voltage characteristic.

What is claimed is:

1. A high voltage semiconductor structure including in combination:
    a semiconductor substrate of a first conductivity type;
    a first region disposed at a first surface of said semiconductor substrate to provide a main rectifying junction;
    a second region of a second conductivity type formed at said first surface of said semiconductor substrate and surrounding said first region, said second region forming a p-n junction between said second region and said semiconductor substrate having a maximum depth below said first surface; and
    a third region of said second conductivity type formed at said first surface of said semiconductor substrate, said third region having reduced conductivity compared to said second region, said third region in contact with a first side of said second region, said third region forming a p-n junction between said third region and said semiconductor substrate having a maximum depth below said first surface greater than said maximum depth of said p-n junction between said second region and said semiconductor substrate.

2. A structure as claimed in claim 1, further including:
a fourth region of said second conductivity type formed at said first surface of said semiconductor substrate, said fourth region surrounding and separate from said third region, said fourth region having conductivity comparable to said second region; and
a fifth region of said second conductivity type formed at said first surface of said semiconductor substrate, said fifth region having conductivity comparable to said third region, said fifth region in contact with a first side of said fourth region.

3. A structure as claimed in claim 1, wherein said first region comprises a region of said second conductivity type, said first region having a dopant concentration comparable to said second region.

4. A structure as claimed in claim 1, wherein said first and second regions comprise boron doped silicon.

5. A structure as claimed in claim 1, further including:
a main p-n junction between said first region and said semiconductor substrate having a maximum depth below said first surface less than said maximum depth of said p-n junction between said third region and said semiconductor substrate.

6. A structure as claimed in claim 1, wherein a center-to-center separation between said second region and said third region is in the range of from one-half to ten micrometers.

7. A structure as claimed in claim 2, further including:
a sixth region of said second conductivity type formed at said first surface of said semiconductor substrate, said sixth region separate from said fifth region, said sixth region having conductivity comparable to said fourth region; and
a seventh region of said second conductivity type formed at said first surface of said semiconductor substrate, said seventh region having conductivity comparable to said fifth region, said seventh region in contact with a first side of said sixth region.

8. A structure as claimed in claim 7, wherein a center-to-center separation between said sixth region and said fourth region is less than a center-to-center separation between said fourth region and said second region.

9. A high voltage semiconductor structure comprising:
a semiconductor substrate having a first surface and a first conductivity type;
an active device having a first outer periphery disposed on said first surface;
a first region disposed on said first surface, said first region spaced apart from and surrounding said first outer periphery, said first region having a second conductivity type, a first maximum junction depth and a second outer periphery; and
a second region disposed on said first surface, said second region surrounding and in contact with said second outer periphery, said second region having said second conductivity type of reduced conductivity compared to said first region and a second maximum junction depth, wherein said second maximum junction depth is greater than said first maximum junction depth.

* * * * *